United States Patent
Gao et al.

(10) Patent No.: US 10,978,500 B2
(45) Date of Patent: Apr. 13, 2021

(54) FLEXIBLE BASE SUBSTRATE AND FABRICATION METHOD THEREOF

(71) Applicant: BOE Technology Group Co., Ltd., Beijing (CN)

(72) Inventors: Tao Gao, Beijing (CN); Xue Mao, Beijing (CN); Weifeng Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/428,504

(22) Filed: May 31, 2019

(65) Prior Publication Data

US 2019/0288016 A1    Sep. 19, 2019

Related U.S. Application Data

(63) Continuation of application No. 14/770,892, filed as application No. PCT/CN2015/074511 on Mar. 18, 2015, now Pat. No. 10,355,032.

(30) Foreign Application Priority Data

Oct. 28, 2014   (CN) .......................... 201410588863.5

(51) Int. Cl.
| | |
|---|---|
| *H01L 27/12* | (2006.01) |
| *H01L 29/786* | (2006.01) |
| *B32B 27/06* | (2006.01) |
| *B32B 27/28* | (2006.01) |
| *B32B 27/36* | (2006.01) |

(Continued)

(52) U.S. Cl.
CPC .......... *H01L 27/1262* (2013.01); *B32B 27/06* (2013.01); *B32B 27/281* (2013.01);
(Continued)

(58) Field of Classification Search
CPC ......... H01L 51/0097; H01L 2251/5338; H01L 2224/0401; H01L 21/563; H01L 27/1262;
(Continued)

(56) References Cited

U.S. PATENT DOCUMENTS

| | | |
|---|---|---|
| 533,262 A | 1/1895 | Alford |
| 2004/0124763 A1 | 7/2004 | Nathan et al. |

(Continued)

FOREIGN PATENT DOCUMENTS

| | | |
|---|---|---|
| CN | 101853789 A | 10/2010 |
| CN | 102185023 A | 9/2011 |

(Continued)

OTHER PUBLICATIONS

Jun. 26, 2015—International Search Report and Written Opinion Appn PCT/CN2015/074511 with English Tran.

(Continued)

*Primary Examiner* — Scott W Dodds
(74) *Attorney, Agent, or Firm* — Banner & Witcoff, Ltd.

(57) ABSTRACT

Embodiments of the present invention provide a flexible base substrate and a fabrication method thereof. The flexible base substrate comprises: a first flexible film layer, having an upper surface and a lower surface opposite to each other, wherein a plurality of concave parts are arranged on the lower surface of the first flexible film layer.

10 Claims, 1 Drawing Sheet

(51) Int. Cl.
  *B32B 37/14* (2006.01)
  *H01L 21/683* (2006.01)
  *H01L 23/13* (2006.01)
  *H01L 23/18* (2006.01)

(52) U.S. Cl.
  CPC ............ *B32B 27/365* (2013.01); *B32B 37/14* (2013.01); *H01L 21/6835* (2013.01); *H01L 23/13* (2013.01); *H01L 23/18* (2013.01); *H01L 27/1218* (2013.01); *H01L 29/78603* (2013.01); *B32B 2367/00* (2013.01); *B32B 2457/20* (2013.01); *H01L 2221/6835* (2013.01); *H01L 2221/68386* (2013.01)

(58) Field of Classification Search
  CPC ......... H01L 2021/6006; H01L 27/1266; H01L 31/1892; H01L 51/003; H01L 2224/03001; H01L 2224/11001; H01L 2224/27001; H01L 2224/35001; H01L 2224/43001; H01L 2224/80003; H01L 2224/80006; H01L 2224/81001; H01L 2224/81005; H01L 2224/82001; H01L 2224/82005; H01L 2224/83001; H01L 2224/83005; H01L 2224/84001; H01L 2224/84005; H01L 2224/85001; H01L 2224/85005; H01L 2224/86001; H01L 2224/86005; H01L 2224/95001; H01L 2227/326; H01L 21/568
  See application file for complete search history.

(56) References Cited

U.S. PATENT DOCUMENTS

| | | | | |
|---|---|---|---|---|
| 2005/0247978 A1* | 11/2005 | Weng | ................. | H01L 51/0021 257/347 |
| 2006/0093795 A1 | 5/2006 | Wang et al. | | |
| 2006/0145146 A1* | 7/2006 | Suh | ........................ | B82Y 10/00 257/40 |
| 2010/0230039 A1 | 9/2010 | Hubert | | |
| 2012/0228617 A1* | 9/2012 | Ko | ...................... | H01L 51/0097 257/59 |
| 2012/0280229 A1* | 11/2012 | Suzuki | ................ | H01L 27/0688 257/43 |
| 2015/0090960 A1 | 4/2015 | Ma et al. | | |

FOREIGN PATENT DOCUMENTS

| | | |
|---|---|---|
| CN | 102969320 A | 3/2013 |
| CN | 103236504 A | 8/2013 |
| CN | 103311222 A | 9/2013 |
| CN | 104103648 A | 10/2014 |
| CN | 104392901 A | 3/2015 |
| JP | 20139015 A | 1/2013 |

OTHER PUBLICATIONS

Aug. 31, 2016—(CN)—First Office Action Appn 201410588863.5 with English Tran.
Feb. 13, 2017—(CN) Second Office Action Appn 201410588863.5 with English Tran.
Jul. 21, 2017—U.S. Restriction Requirement U.S. Appl. No. 14/770,892.
Dec. 26, 2017—U.S. Restriction Requirement U.S. Appl. No. 14/770,892.
Mar. 27, 2018—U.S. Office Action U.S. Appl. No. 14/770,892.
Jul. 16, 2018—U.S.—Final Office Action U.S. Appl. No. 14/770,892.
Mar. 7, 2019—U.S. Notice of Allowance U.S. Appl. No. 14/770,892.
JiXudong ,"New Technology for Manufacturing Low Temperature Polysilicon Thin Film Transistor (p-Si TFT)", vol. 44, Issue 1, 2003, Electro. Optics Technology.

* cited by examiner

FLEXIBLE BASE SUBSTRATE AND FABRICATION METHOD THEREOF

The application is a continuation of U.S. application Ser. No. 14/770,892, filed Aug. 27, 2015, which is a U.S. National Phase Entry of International Application No. PCT/CN2015/074511 filed on Mar. 18, 2015, designating the United States of America and claiming priority to Chinese Patent Application No. 201410588863.5 filed on Oct. 28, 2014. The present application claims priority to and the benefit of the above-identified applications and the above-identified applications are incorporated by reference herein in their entirety.

TECHNICAL FIELD

Embodiments of the invention relate to a flexible base substrate and a fabrication method thereof.

BACKGROUND

Flexible display, as an important development direction for a next-generation display technology, has characteristics such as flexibility, non-fragility, ultra light and slim, low power consumption, portability and so on, and thus having wide application prospect and good development prospect in these fields such as e-book, mobile communication, laptop, television, public information and so on. Currently, a fabrication method of a flexible display device is usually to adhere a flexible substrate to a rigid carrier substrate by an adhesive, a sacrificial layer, a coating process and the like, then to prepare a display device thereon, and finally to separate the flexible substrate from the carrier substrate by a mechanical method or a laser irradiation method or the like.

In current flexible display devices, a wiring structure of a flexible substrate (mainly including a gate electrode signal line, a common electrode wire, a data signal line, etc.) is mostly made of metal, metal alloy or metal oxide, which may have good flexibility in one direction, but may have poor flexibility in a direction perpendicular to the one direction. In particular, when a flexible substrate is covered with an inorganic film layer, since film stress of the inorganic thin film layer tends to be large, when the flexible substrate is peeled off from the rigid carrier substrate, the flexible substrate may have unwanted curl due to the film stress, so performance of the display device is affected. When the curl is too serious, even the display device on the flexible substrate may be damaged, resulting in the final display device to become a defective product.

SUMMARY

An embodiment of the present invention provides a flexible base substrate, comprising: a first flexible film layer, having an upper surface and a lower surface opposite to each other, wherein a plurality of concave parts are arranged on the lower surface of the first flexible film layer.

Another embodiment of the present invention provides a fabrication method of a flexible base substrate, comprising: forming a plurality of protrusion parts on a carrier substrate; forming a first flexible film layer on the carrier substrate with the plurality of protrusion parts formed thereon; and separating the carrier substrate and the first flexible film layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Hereinafter, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The flexible base substrate and the fabrication method thereof provided by embodiments of the present invention solve the problem of unwanted curl when peeling off a flexible base substrate from a carrier substrate, avoiding damage to performance of the display device, improving display quality of the display device, and preventing the final product from becoming a defective product.

In different embodiments of the present invention, like terms and like reference signs are used to denote like parts, and therefore duplicate description is omitted correspondingly. In addition, the characteristics shown in drawings are not necessarily drawn by scale.

Figure 1:
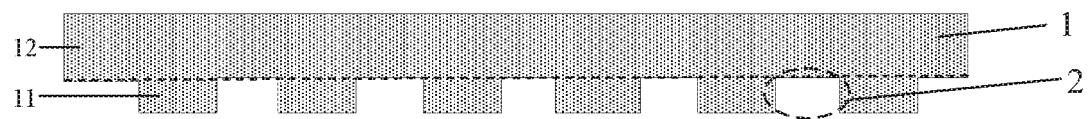
FIG. 1 is a structural schematic diagram of a flexible base substrate provided by an embodiment of the present invention.

An embodiment of the present invention provides a flexible base substrate, made of flexible material; with reference to FIG. 1, the flexible base substrate comprises: a first flexible film layer 1, having an upper surface and a lower surface. A display device can be formed on the upper surface of the first flexible film layer 1. A plurality of concave parts 2 are arranged on the lower surface of the first flexible film layer 1, as shown by a dotted circle in FIG. 1. The plurality of concave parts 2, for example, are a plurality of grooves 2 parallel to each other and arranged at equal intervals. The respective grooves 2, for example, have a same depth. Here, concave depth refers to a distance from the deepest concave position of the groove to a plane of the lowest surface of the first flexible film layer 1. For example, the concave depth of the respective grooves 2 is 60~100 μm.

For example, the first flexible film layer 1 provided by the embodiment includes a first sub-layer 11 and a second sub-layer 12 arranged on the first sub-layer 11. In FIG. 1, an interface between the first sub-layer 11 and the second sub-layer 12 is represented by a dotted line. In an example, as shown in FIG. 1, the bottom of the groove 2 meets the interface between the first sub-layer 11 and the second sub-layer 12. In another example, the bottom of the groove 2 can not meet the interface between the first sub-layer 11 and the second sub-layer 12, for example, the bottom of the groove 2 can be located above or below the interface between the first sub-layer 11 and the second sub-layer 12.

The first sub-layer 11 and the second sub-layer 12 can be made of different materials. The materials of the first sub-layer 11 can be: Polyethylene Terephthalate (PET), Polyethylene Naphthalate (PEN), fiber-reinforced material, etc. The materials of the second sub-layer 12 can be: Polyimide (PI), Polycarbonate (PC), Polyether Sulfone (PES), etc. A thickness of the first sub-layer 11, for example, can be 60~100 μm, and a thickness of the second sub-layer 12 can be 5~20 μm. Of course, the first sub-layer 11 and the second sub-layer 12 can also be made of a same material, in this case, the same material can be: at least one of PET, PEN, PI, PC and PES.

The concave parts on the first flexible film layer 1 can be realized by a plurality of independent rectangular concaves or round concaves on the first flexible film layer which are fabricated by a mask.

In the flexible base substrate provided by the embodiment of the present invention, because a plurality of concave parts are formed on the lower surface of the first flexible film layer, there are two different film thicknesses, and the film layers having the two different film thicknesses are arranged alternately; in this way, tensile stress in the film stress on the flexible base substrate is relatively reduced and can be offset by contraction stress generated in respective film layers of the display device, so when the flexible base substrate is peeled off from the carrier substrate, unwanted deformation may not be caused by the presence of film stress, and thus performance of the display device is not damaged.

In the flexible base substrate provided by the embodiment of the present invention, a plurality of concave parts are arranged on the lower surface of the first flexible film layer, and therefore one protrusion having a certain thickness is formed between every two adjacent concave parts on the lower surface of the first flexible film layer. Thus, when the flexible base substrate provided by the embodiment is peeled off from the carrier substrate, the protrusions on the lower surface of the first flexible film layer can effectively prevent a flexible display device on the flexible base substrate from being curled due to the presence of stress; And, since there are film layers having different film thicknesses in the first flexible film layer, the stress in the substrate itself is released, such that the bending direction of the display device is controllable, and it is ensured that the non-bending direction of the display device can be firmly positioned, which solves the problem of unwanted curl when peeling off the flexible base substrate from the carrier substrate in the current fabrication process of display device, avoids damage to performance of the display device, improves display quality of the display device, and prevents the final product from becoming a defective product.

Figure 2:
FIG. 2 is a structural schematic diagram of a flexible base substrate provided by another embodiment of the present invention.

Further, with reference to FIG. 2, a flexible base substrate provided by another embodiment of the present invention further comprises: a first buffer layer 3, wherein, the first buffer layer 3 is arranged in concave parts 2 of the first flexible film layer 1.

For example, the first buffer layer and the first flexible film layer are made of different materials.

In an example, the material of the first buffer layer includes: at least one of silicon nitride, silicon oxide, and aluminum oxide.

In another example, the material of the first buffer layer include: at least one of carbon nanotube, graphene, molybdenum, copper, and aluminum.

The first buffer layer 3, for example, has a thickness of 60~100 μm.

In the embodiment, the first sub-layer 11 and the second sub-layer 12 of the first flexible film layer are made of the same material, and the same material can be: Polyethylene Terephthalate (PET), Polyethylene Naphthalate (PEN), Polycarbonate (PC), Polyether Sulfone (PES), Polyimide (PI) or fiber-reinforced material.

For example, the concave parts 2 of the first flexible film layer is fully filled the first buffer layer 3.

The flexible base substrate in the embodiment has two different materials in general, and the two different materials alternately appear, so that the flexible base substrate has two film stresses of different levels, and the two film stress of different levels alternately appear. Thus, tensile stress in the film stress on the flexible base substrate relatively decreases, and can be offset by contraction stress generated in respective film layers of the display device. When the flexible base substrate provided by the embodiment of the present invention is peeled off from the carrier substrate, unwanted deformation may not be caused by the presence of film stress, and thus performance of the display device may not be damaged.

Figure 3:
FIG. 3 is a structural schematic diagram of a flexible base substrate provided by still another embodiment of the present invention.

Further, with reference to FIG. 3, a flexible base substrate provided by still another embodiment of the present invention further comprises: a flexible substrate film layer 4, wherein, the flexible substrate film layer 4 is arranged under the first flexible film layer 1 and the first buffer layer 3, for example, the flexible substrate film layer 4 is adhered on the lower surface of the first flexible film layer 1 and the first buffer layer 3.

In an example, the first flexible film layer 1 and the first buffer layer 3 cover the flexible substrate film layer 4.

In an example, the flexible substrate film layer and the first flexible film layer can be made of a same material. The flexible substrate film layer can have a thickness of 5~10 μm.

For example, with the flexible substrate film layer, a better film forming effect can be achieved when forming the whole flexible base substrate, thus ensuring display quality of the display device to be formed on the flexible base substrate.

Figure 4:
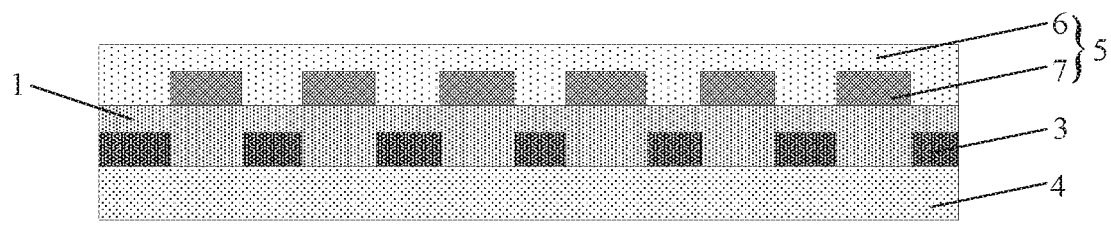
FIG. 4 is a structural schematic diagram of a flexible base substrate provided by yet another embodiment of the present invention.

Further, for example, with reference to FIG. 4, a flexible base substrate provided by yet another embodiment of the present invention further comprises: at least one flexible base film layer 5, and the flexible base film layer 5 includes: a second flexible film layer 6 and a second buffer layer 7, wherein:

the second flexible film layer 6, for example, is provided with a plurality of concave parts having the same depth formed on the lower surface thereof.

The second buffer layer 7 is arranged in the concave parts of the second flexible film layer 6.

The flexible base film layer 5 is arranged on the first flexible film layer 1 and covers the first flexible film layer 1.

In an example, the second buffer layer 7 is arranged to correspond to the protrusions between the concave parts 2 on the lower surface of the first flexible film layer 1. Further, the second buffer layer 7 is formed right above the protrusions between the concave parts 2 on the lower surface of the first flexible film layer 1, and has same width as the corresponding protrusions; in this way, there is a complementary relationship between the positions of the second buffer layer 7 and the first buffer layer 3.

For example, the second flexible film layer 6 and the first flexible film layer 1 can have a same thickness and be made of a same material; the second buffer layer 7 and the first buffer layer 3 can have a same thickness and be made of a same material.

For example, in the embodiment shown in FIG. 4, a case that the flexible base substrate includes one flexible base film layer 5 is taken for example. In the embodiment of the present invention, the number of the flexible base film layer is not exclusively limited here; and the number of the flexible base film layers, for example, may be 2. In a fabrication process of a flexible base substrate including two flexible base film layers, for example, a first buffer layer and a first flexible film layer are formed at first, and then a first flexible base film layer is formed on the first flexible film layer, and finally a second flexible base film layer is formed on the first flexible base film layer; after all film layers are formed, a high temperature annealing process is performed for 5 to 8 hours at a temperature of 250° C.-450° C. with nitrogen, so that the respective film layers of final flexible base substrate are crosslinked and cured and tightly connected together. It should be noted that, there is a complementary relationship between the position of the second buffer layer in the second flexible base film layer and the position of the second buffer layer in the first flexible base film layer. In a similar way, there is a complementary relationship among positions of all adjacent buffer layers in the flexible base substrate.

The flexible base substrate provided by the embodiment of the present invention includes the first flexible film layer with plurality of concave parts arranged on the lower surface thereof, in this way, due to the concave parts arranged on the lower surface of the first flexible film layer in the flexible substrate, there are protrusions having a certain thickness on the first flexible film layer, and the protrusions in the first flexible film layer can effectively prevent a flexible display device from being curled by the presence of stress when the flexible substrate is peeled off from the carrier substrate. In addition, since there are film layers having different thicknesses in the first flexible film layer, the stress in the substrate is released, such that the bending direction of the display device is controllable, and it is ensured that the non-bending direction of the display device can be firmly positioned, which solves the problem of unwanted curl when peeling off the flexible base substrate from the carrier substrate in the fabrication process of current display device, avoids damage to performance of the display device, improves display quality of the display device, and prevents the final product from becoming a defective product.

An embodiment of the present invention provides a fabrication method of a flexible base substrate, comprising steps of:

101: forming a plurality of protrusion parts on a carrier substrate.

For example, a photoresist layer can be coated on the carrier substrate (not shown), and then is exposed with a mask, developed and etched to form the plurality of protrusion parts having a same thickness. Here, the plurality of protrusion parts may correspond to a plurality of concave parts 2 in the embodiment shown in FIGS. 1 to 4. Planar shapes of the protrusion parts may be rectangular, round, or any suitable shapes.

102: forming a first sub-layer of a first flexible film layer on the carrier substrate with the protrusion parts formed thereon.

For example, a solution-like layer of PET, PEN, or fiber-reinforced material with a thickness of 60~100 μm is coated on the carrier substrate with the protrusion parts formed thereon by using a coating process, so as to form the first sub-layer 11 of the first flexible film layer 1.

103: forming a second sub-layer of the first flexible film layer on the carrier substrate with the protrusion parts and the first sub-layer of the first flexible film layer formed thereon.

For example, a solution-like layer of PI, PC, or PES with a thickness of 5~20 μm is coated on the carrier substrate with the protrusion parts and the first sub-layer 11 of the first flexible film layer 1 formed thereon by using a coating process, so as to form the second sub-layer 12 of the first flexible film layer 1; and then the first sub-layer 11 and the second sub-layer 12 are formed as a whole by high temperature baking and curing, and thus the first flexible film layer is obtained.

104: separating the carrier substrate and the first sub-layer and the second sub-layer of the first flexible film layer, so as to obtain the flexible base substrate as shown in FIG. 1.

Another embodiment of the present invention provides a fabrication method of a flexible base substrate, comprising steps of:

201: forming a plurality of protrusion parts on a carrier substrate.

For example, a photoresist layer may be coated on the carrier substrate (not shown), and then is exposed with a mask, developed and etched to form the plurality of protrusion parts having a same thickness. Here, the plurality of protrusion parts may be used for forming a plurality of concave parts 2 in the embodiment shown in FIGS. 1 to 4. Planar shapes of the protrusion parts may be rectangular, round, or any suitable shapes.

202: forming a first flexible film layer on the carrier substrate with the protrusion parts formed thereon.

For example, a solution-like layer of PI, PC, PES PEN or fiber-reinforced material is coated on the carrier substrate with the protrusion parts formed thereon by using a coating process, so as to cover the plurality of protrusion parts, and then a patterned flexible film layer is formed by high temperature curing.

203: separating the carrier substrate and the first flexible film layer.

Still another embodiment of the present invention provides a fabrication method of a flexible base substrate, comprising steps of:

301: forming a first buffer layer on a carrier substrate.

For example, a buffer material layer with a thickness of 60~100 μm is coated on the carrier substrate by using a coating process. The buffer material layer is patterned to form the plurality of protrusion parts which may correspond to the first buffer layer 3 shown in FIGS. 2 to 4 in the application. The materials of the first buffer layer may be a composite film made of one or more non-metal films such as silicon nitride, silicon oxide, aluminum oxide and so on, or a composite film made of one or more metal films such as carbon nanotube, graphene, molybdenum, copper, aluminum and so on. The first buffer layer has a thickness of 60~100 μm.

302: forming a first flexible film layer on the first buffer layer, to cover the first buffer layer and the carrier substrate.

For example, a solution-like thin film with a thickness of 5 μm~10 μm is coated by a coating process, and pre-cured under a temperature of 100° C.-200° C. with nitrogen, to form a patterned first flexible film layer, wherein, the time for curing may be 30 min-60 min; the first flexible film layer can be made of PET, PEN, PC, PES, PI and so on.

303: separating the carrier substrate and the first flexible film layer and the first buffer layer, to obtain a flexible base substrate as shown in FIG. 2.

Yet another embodiment of the present invention provides a fabrication method of a flexible base substrate, comprising steps of:

401: forming a flexible substrate film layer on a carrier substrate.

For example, a solution-like thin film with a thickness of 5 μm~10 μm is coated on the carrier substrate by using a coating process, and cured for 30 min~60 min under a temperature of 100° C.-200° C. with nitrogen, so as to form a patterned flexible base film layer. Herein, the flexible base film layer can be made of PET, PEN, PC, PES, PI and so on.

402: forming a first buffer layer on the flexible substrate film layer.

403: forming a first flexible film layer on the first buffer layer, to cover the first buffer layer and the flexible base film layer.

404: forming at least one flexible base film layer including a second flexible film layer and a second buffer layer on the first flexible film layer.

Wherein, the flexible base film layer covers the first flexible film layer, and a plurality of concave parts are arranged on the lower surface of the second flexible film layer, and the second buffer layer is arranged in the concave parts of the second flexible film layer.

For example, the second flexible film layer can be formed by a process the same as that for forming the first flexible film layer; and the second buffer layer can be formed by a process the same as that for forming the first buffer layer. The second flexible film layer and the first flexible film layer have the same thickness and are made of the same material, and the second buffer layer and the first buffer layer have the same thickness and are made of the same material.

405: separating the carrier substrate and the flexible substrate film layer, to obtain a flexible base substrate as shown in FIG. 4.

It should be noted that, in the embodiment, explanations of steps the same as the above-described embodiment can refer to the explanations in the above-described embodiment, which will be not repeated here.

The fabrication method of the flexible base substrate provided by the embodiments of the present invention can be used to make a flexible base substrate including a first flexible film layer with a plurality of concave parts formed on the lower surface thereof. Due to the concave parts on the lower surface of the first flexible film layer in the flexible substrate, the first flexible film layer has protrusions having a certain thickness. When the flexible base substrate is peeled off from the carrier substrate, the protrusions in the first flexible film layer can effectively prevent a flexible display device from being curled due to presence of stress; In addition, since there are film layers having different thicknesses in the first flexible film layer, the stress in the substrate is released, such that the bending direction of the display device is controllable, and it is ensured that the non-bending direction of the display device can be firmly positioned, which solves the problem of unwanted curl when peeling off the flexible base substrate from the carrier substrate in the fabrication process of current display device, avoids damage to performance of the display device, improves display quality of the display device, and prevents the final product from becoming a defective product.

According to the above description, the embodiments according to the present disclosure at least can provide structures and methods as follows:

(1) A flexible base substrate, comprising: a first flexible film layer, having an upper surface and a lower surface opposite to each other, wherein a plurality of concave parts are arranged on the lower surface of the first flexible film layer.

(2) The flexible base substrate according to (1), wherein the plurality of concave parts have a same depth.

(3) The flexible base substrate according to (1) or (2), wherein, the flexible base substrate further comprises a first buffer layer arranged in the concave parts on the lower surface of the first flexible film layer, the first buffer layer and the first flexible film layer being made of different materials.

(4) The flexible base substrate according to (3), wherein, the concave parts on the lower surface of the first flexible film layer is fully filled with the first buffer layer.

(5) The flexible base substrate according to (3) or (4), further comprising a flexible substrate film layer arranged under the first flexible film layer and the first buffer layer, the flexible substrate film layer being covered by the first flexible film layer and the first buffer layer.

(6) The flexible base substrate according to any one of (1) to (5), further comprising: at least one flexible base film layer, the flexible base film layer including: a second flexible film layer and a second buffer layer, wherein, a plurality of concave parts having a same depth are arranged on a lower surface of the second flexible film layer, and the second buffer layer is arranged in the concave parts of the second flexible film layer, the flexible base film layer being located above the first flexible film layer and covering the first flexible film layer.

(7) The flexible base substrate according to (6), wherein, there is a complementary relationship between a position of the second buffer layer and a position of the first buffer layer.

(8) The flexible base substrate according to any one of (1) to (7), wherein,
a material of the first flexible film layer includes: Polyethylene Terephthalate, Polyethylene Naphthalate, Polycarbonate, Polyether Sulfone, Polyimide or fiber-reinforced material.

(9) The flexible base substrate according to any one of (3) to (8), wherein,
a material of the first buffer layer includes: at least one of silicon nitride, silicon oxide, and aluminum oxide;
or, the material of the first buffer layer includes: at least one of carbon nanotube, graphene, molybdenum, copper, and aluminum.

(10) The flexible base substrate according to any one of (6) to (9), wherein,
the flexible substrate film layer and the first flexible film layer are made of a same material.

(11) The flexible base substrate according to any one of (1) to (10), wherein,
the first flexible film layer includes a first sub-layer and a second sub-layer arranged thereon, the first sub-layer having a thickness of 60~100 μm, and the second sub-layer having a thickness of 5~20 μm.

(12) The flexible base substrate according to any one of (3) to (11), wherein,
the first buffer layer has a thickness of 60~100 μm.

(13) The flexible base substrate according to any one of (6) to (12), wherein,
the flexible substrate film layer has a thickness of 5~10 μm.

(14) The flexible base substrate according to any one of (6) to (13), wherein,
the second flexible film layer and the first flexible film layer are the same in thickness and material;
the second buffer layer and the first buffer layer are the same in thickness and material;

(15) A fabrication method of a flexible base substrate, comprising:

forming a plurality of protrusion parts on a carrier substrate;

forming a first flexible film layer on the carrier substrate with the plurality of protrusion parts formed thereon; and separating the carrier substrate and the first flexible film layer.

(16) The fabrication method of the flexible base substrate according to (15), wherein, the plurality of protrusion parts along with the first flexible film layer are separated from the carrier substrate.

(17) The fabrication method of the flexible base substrate according to (15) or (16), wherein, the forming a first flexible film layer on the carrier substrate with the plurality of protrusion parts formed thereon includes:

forming a first sub-layer of the first flexible film layer on the carrier substrate with the plurality of protrusion parts formed thereon; and forming a second sub-layer on the carrier substrate with the first sub-layer formed thereon.

(18) The fabrication method of the flexible base substrate according to (15) to (17), further comprising: forming a flexible substrate film layer on the carrier substrate before forming the plurality of protrusion parts on the carrier substrate.

(19) The fabrication method of the flexible base substrate according to any one of (15) to (18), further comprising:

forming at least one layer of flexible base film layer including a second flexible film layer and a second buffer layer on the first flexible film layer; the flexible base film layer covering the first flexible film layer;

wherein, a plurality of concave parts are arranged on a lower surface of the second flexible film layer, and the second buffer layer is arranged in the concave parts of the second flexible film layer.

Although the present disclosure is described in detail hereinbefore with general illustration and embodiments, based on the present disclosure, certain amendments or improvements can be made thereto, which is obvious for those skilled in the art. Therefore, the amendments or improvements made on the present disclosure without departing from the spirit of the present disclosure should be within the scope of the present disclosure.

The present application claims priority of Chinese Patent Application No. 201410588863.5 filed on Oct. 28, 2014, the disclosure of which is incorporated herein by reference in its entirety as part of the present application.

The foregoing embodiments merely are exemplary embodiments of the invention, and not intended to define the scope of the invention; modification or substitution which is easily thought by any person skilled in the art within the technical scope disclosed by the invention should fall into the protection scope of the invention. Therefore, the protection scope of the invention should be the protection scope of the claims.

What is claimed is:

1. A flexible base substrate, comprising: a first flexible film layer, having an upper surface and a lower surface opposite to each other, wherein at least three concave parts are arranged on the lower surface of the first flexible film layer, wherein a first buffer layer is arranged in the at least three concave parts on the lower surface of the first flexible film layer, the first buffer layer and the first flexible film layer are made of different materials, the flexible base substrate further comprises: at least one flexible base film layer, the flexible base film layer comprises: a second flexible film layer and a second buffer layer, at least three concave parts are arranged on a lower surface of the second flexible film layer, the second buffer layer is arranged in the at least three concave parts of the second flexible film layer, the flexible base film layer is located above the first flexible film layer and covers the first flexible film layer, materials of the first buffer layer and the second buffer layer both are a composite film made of one or more metal films comprising at least one of carbon nanotubes, graphene, molybdenum, copper or aluminum, and there are complementary relationships between positions of the at least three concave parts on the lower surface of the first flexible film layer and positions of the at least three concave parts on the lower surface of the second flexible film layer, wherein the first flexible film layer includes a first sub-layer and a second sub-layer arranged thereon, the first sub-layer and the second sub-layer are in direct contact with each other and are made of different materials.

2. The flexible base substrate according to claim 1, wherein the at least three concave parts on the lower surface of the first flexible film layer have a same depth.

3. The flexible base substrate according to claim 1, wherein the at least three concave parts on the lower surface of the first flexible film layer is fully filled with the first buffer layer.

4. The flexible base substrate according to claim 1, further comprising a flexible substrate film layer arranged under the first flexible film layer and the first buffer layer, the flexible substrate film layer being covered by the first flexible film layer and the first buffer layer.

5. The flexible base substrate according to claim 4, wherein the flexible substrate film layer and the first flexible film layer are made of a same material.

6. The flexible base substrate according to claim 4, wherein the flexible substrate film layer has a thickness of 5~10 μm.

7. The flexible base substrate according to claim 1, wherein a material of the first flexible film layer includes: Polyethylene Terephthalate, Polyethylene Naphthalate, Polycarbonate, Polyether Sulfone, Polyimide or fiber-reinforced material.

8. The flexible base substrate according to claim 1, wherein the first sub-layer having a thickness of 60~100 μm, and the second sub-layer having a thickness of 5~20 μm.

9. The flexible base substrate according to claim 1, wherein the first buffer layer has a thickness of 60~100 μm.

10. The flexible base substrate according to claim 1, wherein the second flexible film layer and the first flexible film layer are the same in thickness and material; and the second buffer layer and the first buffer layer are the same in thickness.

* * * * *